United States Patent
Mitani et al.

(10) Patent No.: US 10,379,565 B2
(45) Date of Patent: Aug. 13, 2019

(54) OUTPUT DRIVER CIRCUIT

(71) Applicant: Seiko Instruments Inc., Chiba-shi, Chiba (JP)

(72) Inventors: Masahiro Mitani, Chiba (JP); Minoru Ariyama, Chiba (JP); Daisuke Muraoka, Chiba (JP); Tomoki Hikichi, Chiba (JP)

(73) Assignee: ABLIC INC., Chiba (JP)

(*) Notice: Subject to any disclaimer, the term of this patent is extended or adjusted under 35 U.S.C. 154(b) by 455 days.

(21) Appl. No.: 14/521,057

(22) Filed: Oct. 22, 2014

(65) Prior Publication Data
US 2015/0035567 A1 Feb. 5, 2015

Related U.S. Application Data

(63) Continuation of application No. PCT/JP2013/058681, filed on Mar. 26, 2013.

(30) Foreign Application Priority Data

Apr. 27, 2012 (JP) .................. 2012-103218

(51) Int. Cl.
| | |
|---|---|
| *H03K 3/00* | (2006.01) |
| *G05F 3/26* | (2006.01) |
| *H03K 17/687* | (2006.01) |
| *H03K 19/0185* | (2006.01) |
| *H03K 19/173* | (2006.01) |
| *H02H 9/02* | (2006.01) |
| *H03K 17/0812* | (2006.01) |

(52) U.S. Cl.
CPC ............... *G05F 3/262* (2013.01); *H02H 9/02* (2013.01); *H03K 17/08122* (2013.01); *H03K 17/687* (2013.01); *H03K 19/018507* (2013.01); *H03K 19/1737* (2013.01); *H03K 2217/0063* (2013.01); *H03K 2217/0072* (2013.01); *H03K 2217/0081* (2013.01)

(58) Field of Classification Search
CPC ..................................................... G05F 3/262
USPC .......................................................... 327/108
See application file for complete search history.

(56) References Cited

U.S. PATENT DOCUMENTS

| | | | |
|---|---|---|---|
| 7,740,371 B1* | 6/2010 | Lebens | F21L 4/027 315/127 |
| 8,878,573 B2* | 11/2014 | Sugahara | H03K 17/168 326/83 |
| 2004/0201416 A1* | 10/2004 | Wyers | H03F 3/45192 330/2 |

(Continued)

FOREIGN PATENT DOCUMENTS

JP   6-38363 A   2/1994

*Primary Examiner* — Ryan Jager
(74) *Attorney, Agent, or Firm* — Brinks Gilson & Lione

(57) ABSTRACT

An output driver circuit provides an overcurrent protection function by a simple circuit configuration. The output driver circuit has a constant-current circuit, a constant-current mirror MOS transistor, and a selector circuit. The constant-current mirror MOS transistor and the output MOS transistor constitute a current mirror circuit. The gate of the output MOS transistor is controlled by a voltage based on a constant current generated by the constant-current mirror MOS transistor, thereby limiting the current flowing between the source and the drain of the output MOS transistor.

3 Claims, 3 Drawing Sheets

(56) References Cited

U.S. PATENT DOCUMENTS

| | | | | |
|---|---|---|---|---|
| 2011/0156822 A1* | 6/2011 | Takano | ............... | G05F 3/242 |
| | | | | 331/57 |
| 2011/0227649 A1* | 9/2011 | Montalvo | ............ | H03F 3/195 |
| | | | | 330/254 |
| 2012/0007680 A1* | 1/2012 | Hijikata | ............ | H03F 1/0261 |
| | | | | 330/278 |
| 2012/0019325 A1* | 1/2012 | Shih | ............ | H03F 1/0277 |
| | | | | 330/291 |
| 2012/0126895 A1* | 5/2012 | Jang | ............ | H03G 1/0088 |
| | | | | 330/253 |
| 2015/0326804 A1* | 11/2015 | Lee | ............ | H04N 5/3575 |
| | | | | 348/308 |

* cited by examiner

OUTPUT DRIVER CIRCUIT

RELATED APPLICATIONS

This application is a continuation of PCT/JP2013/058681 filed on Mar. 26, 2013, which claims priority to Japanese Application No. 2012-103218 filed on Apr. 27, 2012. The entire contents of these applications are incorporated herein by reference.

BACKGROUND OF THE INVENTION

Field of the Invention

The present invention relates to an output driver circuit provided with an overcurrent protection function.

Description of the Related Art

A conventional output driver circuit with an overcurrent protection function will be described. FIG. 5 is a circuit diagram illustrating the conventional output driver circuit.

A conventional output driver circuit 50 with an overcurrent protection function includes an NMOS transistor 55, which is an output driver connected to an output terminal 57, a sense resistor 58, which is connected to a current path of the output driver and which monitors an output current, a reference voltage circuit 51, which outputs a reference voltage, a comparator 52, which compares a voltage generated at the sense resistor 58 and the reference voltage, and an NOR circuit 54, which controls the gate of the NMOS transistor 55 according to an output signal of the comparator 52 and a signal of an input terminal 53.

If the output terminal 57 and a power source are short-circuited with the NMOS transistor 55 in an ON state, then a large current flows between the drain and the source of the NMOS transistor 55. At this time, if a voltage generated at the sense resistor 58 increases to be higher than a reference voltage, then control is carried out to cause an output signal of the comparator 52 to switch to "H" level, thereby turning the NMOS transistor 55 off. This interrupts the flow of the current between the source and the drain of the NMOS transistor 55, thus protecting the IC from being damaged by an overcurrent.

Alternatively, an NMOS transistor may be connected in place of the sense resistor 58 to provide the same protection (refer to, for example, Japanese Patent Application Laid-Open No. 6-38363).

However, the conventional output driver circuit with an overcurrent protection function has been posing a problem in that the need for a comparator and a reference voltage circuit inevitably results in a large circuit scale.

Further, there has been another problem in that a sense resistor is connected to the source of an NMOS transistor, which is an output driver, thus deteriorating the drive capability of the output driver during a normal operation.

SUMMARY OF THE INVENTION

An output driver circuit in accordance with the present invention has been made with a view toward overcoming the aforesaid drawbacks, and an object of the invention is to provide an output driver circuit with an overcurrent protection function, which has a simple circuit configuration and which does not deteriorate the drive capability of an output driver.

To this end, the present invention provides an output driver circuit with an open-drain output, which is provided with an overcurrent protection function, including: a constant-current circuit which supplies a constant current; a constant-current mirror MOS transistor which generates a voltage based on the constant current; a selector circuit which receives a voltage of the constant-current mirror MOS transistor and a voltage of a first supply terminal and outputs one of the received voltages according to a signal supplied to an input terminal of the output driver circuit; an output MOS transistor with a gate thereof connected to an output terminal of the selector circuit, a drain thereof connected to an output terminal of the output driver circuit and a source thereof connected to the first supply terminal, wherein a current flowing between the source and the drain of the output MOS transistor is limited by a voltage based on the constant current.

The output driver circuit in accordance with the present invention is configured to control the current of the output MOS transistor by the current mirror circuit to implement the overcurrent protection function. This obviates the need for a sense resistor for the source of the output MOS transistor and also obviates the need for a comparator and a reference voltage circuit, thus making it possible to provide an output driver circuit with an overcurrent protection function that has a simple configuration and does not incur deterioration of the drive capability in a normal operation.

DETAILED DESCRIPTION OF THE PREFERRED EMBODIMENTS

The following will describe embodiments of the present invention with reference to the accompanying drawings.

Figure 1:
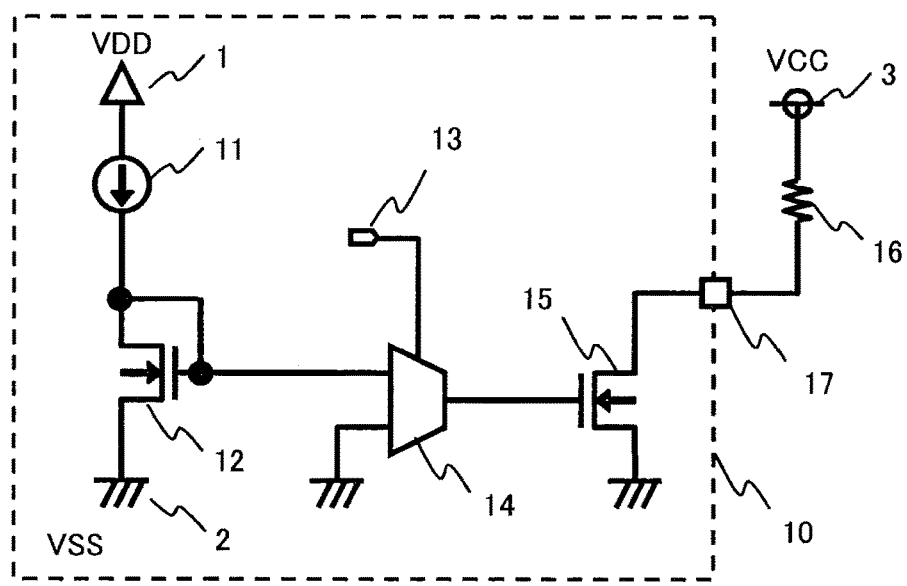
FIG. 1 is a circuit diagram illustrating an output driver circuit according to an embodiment of the present invention.

FIG. 1 is a circuit diagram illustrating an output driver circuit of an embodiment.

An output driver circuit 10 includes a constant-current circuit 11, a constant-current mirror MOS transistor 12, an input terminal 13, a selector circuit 14, and an NMOS transistor 15.

The gate of the NMOS transistor 15 is connected to the output of the selector circuit 14, the source thereof is connected to a grounding terminal 2, and the drain thereof is connected to an output terminal 17. The NMOS transistor 15 is an open-drain type output driver, the output terminal 17 being connected to a supply terminal 3 of a circuit in a subsequent stage through the intermediary of an external pull-up resistor 16.

The selector circuit 14 is provided between the constant-current mirror MOS transistor 12 and the NMOS transistor 15 so as to select either an output voltage of the constant-current mirror MOS transistor 12 or a ground voltage VSS according to a voltage at the input terminal 13.

The constant-current mirror MOS transistor 12 receives a current generated in the constant-current circuit 11 connected to the grounding terminal 2, and outputs a voltage for limiting the current between the source and the drain of the NMOS transistor 15. In other words, the constant-current mirror MOS transistor 12 constitutes, together with the NMOS transistor 15, a current mirror circuit.

The operation of the output driver circuit 10 of the present embodiment will now be described.

If the voltage of the input terminal 13 is "L" level, then the selector circuit 14 outputs the ground voltage VSS. Hence, the NMOS transistor 15 turns off, placing the output terminal 17 of the output driver circuit 10 in a high impedance state. Hence, the output terminal 17 of the output driver circuit 10 is pulled up to a supply voltage VCC of a circuit in the subsequent stage, the output terminal 17 being connected to the input terminal of the circuit in the subsequent stage. In other words, the output driver circuit 10 outputs "H" level to the output terminal 17.

If the voltage of the input terminal 13 is "H" level, then the selector circuit 14 outputs a gate voltage of the constant-current mirror MOS transistor 12. This causes the NMOS transistor 15 to turn on, and a current determined on the basis of the supply voltage VCC and the resistance value of the pull-up resistor 16 will flow between the source and the drain. In other words, the output driver circuit 10 outputs "L" level to the output terminal 17.

It is assumed that the output terminal 17 of the output driver circuit 10 and the supply voltage VCC of the circuit in the subsequent stage are short-circuited for some reason. If the NMOS transistor 15 is on, then the supply voltage VCC and the ground voltage VSS will be short-circuited, causing an overcurrent to flow between the source and the drain of the NMOS transistor 15.

A current limit value Ilimit of the current flowing between the source and the drain of the NMOS transistor 15 is determined by a current Iconst generated in the constant-current circuit 11 and the current mirror ratio of the current mirror circuit. Thus, the current flowing between the source and the drain of the NMOS transistor 15 will be limited to the current limit value Ilimit regardless of the supply voltage VCC in the subsequent stage or the resistance value of the pull-up resistor 16. The current limit value Ilimit, which denotes a value for limiting an overcurrent, is set to a value that is sufficiently larger than the current that flow when the NMOS transistor 15 turns on at the time of the normal operation.

As described above, the output driver circuit of the embodiment is configured to control the gate voltage of the NMOS transistor 15 by providing the constant-current mirror MOS transistor 12 and the selector circuit 14, thus permitting the function for protecting the output terminal 17 from an overcurrent by using the simple circuit configuration.

Figure 2:
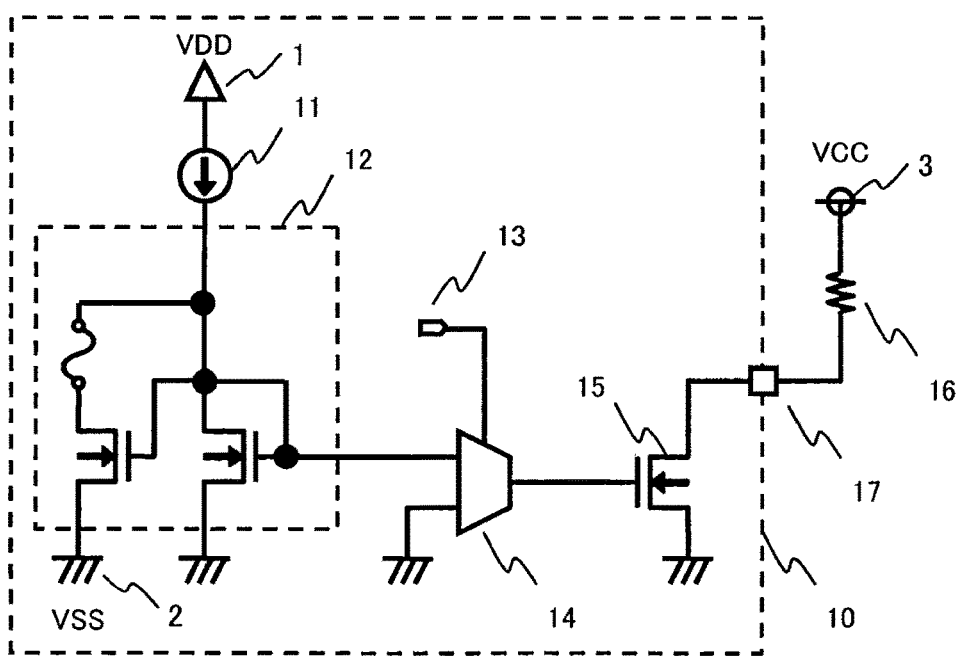
FIG. 2 is a circuit diagram illustrating another example of the output driver circuit according to the embodiment.

As illustrated in FIG. 2, the constant-current mirror MOS transistor 12 may be provided with an NMOS transistor and a fuse for adjusting current so as to make the current mirror ratio adjustable. Configuring the constant-current mirror MOS transistor 12 in this manner makes it possible to restrain variations in the constant current Iconst and variations in the current mirror ratio. Hence, the accuracy of the current limit value Ilimit can be enhanced.

Further, although not shown, the constant-current circuit 11 may be adjusted by, for example, fuse trimming, so as to restrain variations in the current limit value Ilimit.

Figure 3:
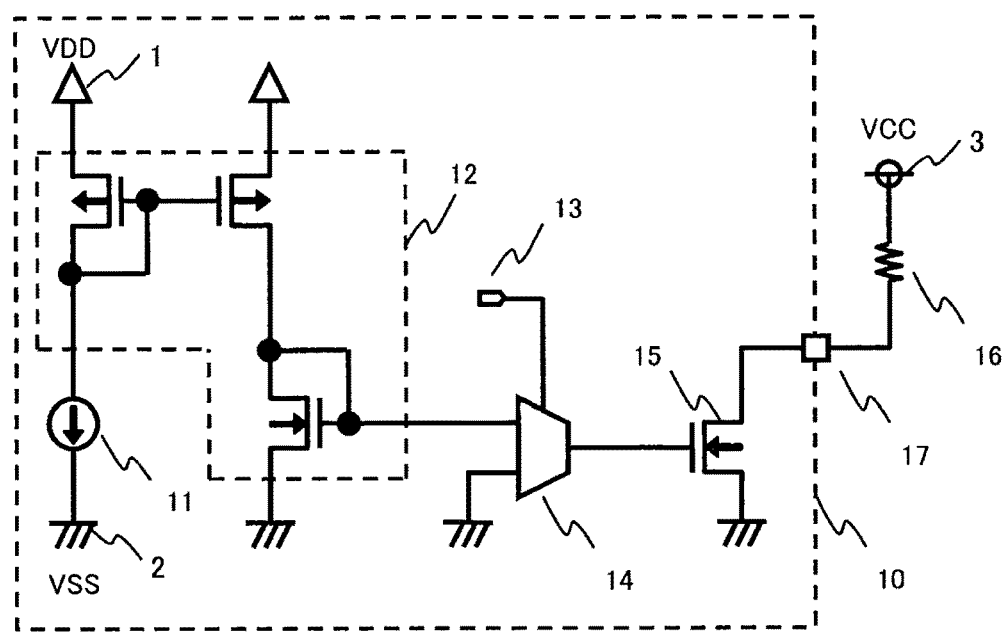
FIG. 3 is a circuit diagram illustrating yet another example of the output driver circuit according to the embodiment.

Further, as illustrated in FIG. 3, the constant-current mirror MOS transistor 12 may be configured to include a PMOS current mirror circuit that receives a current generated in the constant-current circuit 11 connected to the grounding terminal 2. The PMOS current mirror circuit multiplies the current of the constant-current circuit 11 by the current mirror ratio and supplies the obtained current to a saturation-connected NMOS transistor. Configuring the constant-current mirror MOS transistor 12 to provide two stages of the PMOS current mirror circuit and the NMOS current mirror circuit permits a reduced circuit area. Further, the current mirrors may be provided in any number of stages, and fuse trimming or the like may be used to make the current mirror ratio adjustable.

Figure 4:
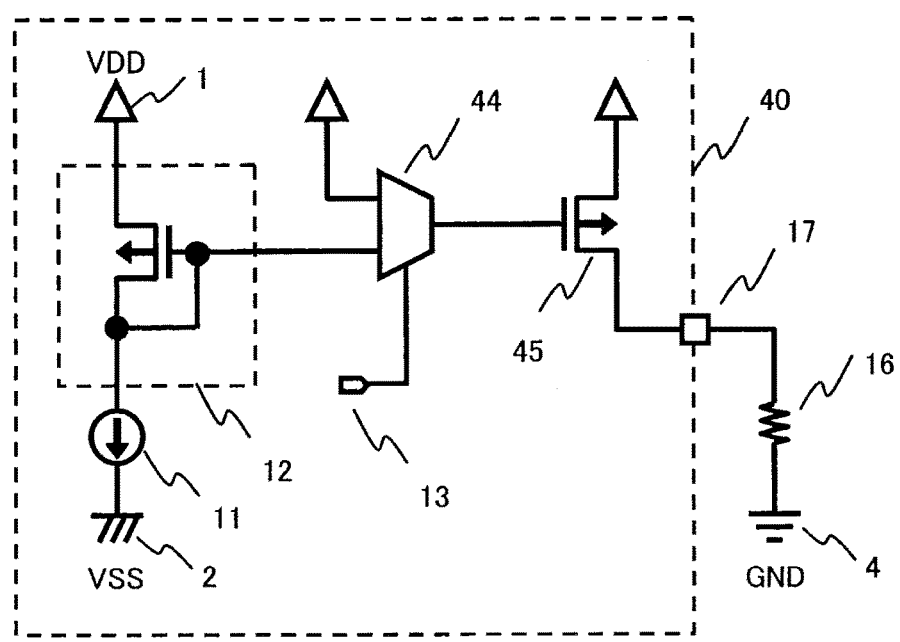
FIG. 4 is a circuit diagram illustrating a further example of the output driver circuit according to the embodiment.
Figure 5:
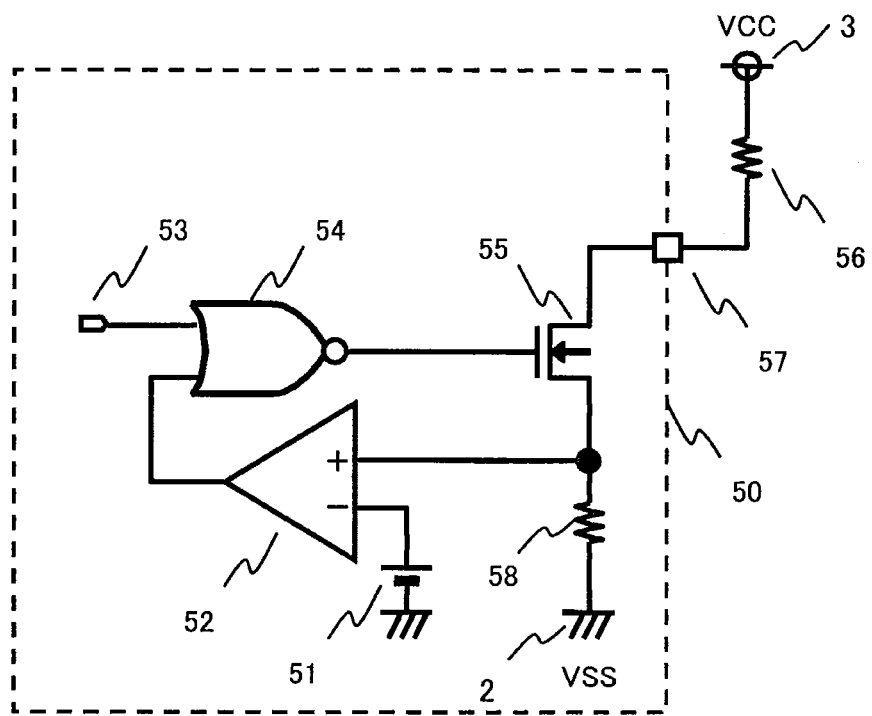
FIG. 5 is a circuit diagram illustrating a conventional output driver circuit.

As illustrated in FIG. 4, in the case of a Pch open-drain type output driver circuit, the overcurrent protection function can be accomplished in the same manner by using the constant-current mirror MOS transistor 12, a selector circuit 44, and an output MOS transistor 45. In this case, the output terminal 17 is connected to a grounding terminal 4 of the circuit in a subsequent stage through the intermediary of an external pull-up resistor 16. Further, the fuse trimming or the like may be used to add a function for restraining the variations in the current limit value Ilimit.

What is claimed is:

1. An output driver circuit with an open-drain output, comprising:
   a constant-current circuit which supplies a constant current;
   a constant-current mirror MOS transistor which generates a voltage based on the constant current;
   a selector circuit which separately receives the voltage based on the constant current that is generated by the constant-current mirror MOS transistor and a voltage of a first supply terminal and outputs one of the received voltages according to a signal supplied to an input terminal of the output driver circuit; and
   an output MOS transistor having a gate thereof connected to an output terminal of the selector circuit, an open drain output thereof connected to an output terminal of the output driver circuit, and a source thereof connected to the first supply terminal, the output terminal connected to a second supply terminal through an external pull-up resistor,
   wherein the constant-current mirror MOS transistor and the output MOS transistor constitute a current mirror circuit, the selector circuit is between the constant-current mirror MOS transistor and the output MOS transistor, and
   a current flowing between the source and the drain of the output MOS transistor is limited by a voltage based on the constant current.

2. The output driver circuit according to claim 1, wherein the current mirror circuit has a fuse configured to adjust a current mirror ratio to adjust a current limit value of the output MOS transistor.

3. The output driver circuit according to claim 1, wherein the current mirror circuit has a fuse configured to adjust a current value so as to adjust a current limit value of the output MOS transistor.

* * * * *